United States Patent [19]

Ijichi et al.

[11] Patent Number: 5,394,424
[45] Date of Patent: Feb. 28, 1995

[54] SEMICONDUCTOR LASER DEVICE

[75] Inventors: Tetsuro Ijichi; Michinori Irikawa, both of Yokohama, Japan; Ranjit S. Mand, San Jose, Calif.; Jingming Xu, Ontario, Canada

[73] Assignee: The Furukawa Electric Co., Ltd., Tokyo, Japan

[21] Appl. No.: 91,719

[22] Filed: Jul. 14, 1993

[51] Int. Cl.⁶ ............................................. H01S 3/19
[52] U.S. Cl. ...................................... 372/46; 372/47; 372/45
[58] Field of Search ............................ 372/46, 45, 47

[56] References Cited

PUBLICATIONS

Ijichi et al, "High Power Operation of 0.98 μm InGaAs/GaAs/InGaP Strained Layer Quantum Well Laser", Denshi Tokyo No. 30, 1991, pp. 21–24.

Ohkubo et al, "Aluminium Free InGaAs/GaAs/InGaAsP/InGaP Grinsch SL-SQW Lasers at 0.98 μm", Electronics Letters, Jun. 4, 1992, vol. 28, No. 12, pp. 1149–1150.

Ohkubo et al. "0.98 μm InGaAs-InGaAsP-InGaP GRIN-SCH SL-SQW Laser for Coupling High Optical Power into Single-Mode Fiber" IEEE Jour. of Quant Electronics, vol. 29, No. 6, Jun. 1993, pp. 1932–1935.

Sin et al, "High Power InGaAs-GaAs-InGaP Distributed Feedbacks Buried Heterostructure Strained Quantum Well Lasers Grown by Three Step MOVPE", Electronics Letters, Feb. 4, 1993, vol. 29, No. 3, pp. 253–254.

*Primary Examiner*—Georgia Y. Epps
*Attorney, Agent, or Firm*—Jacobson, Price, Holman & Stern

[57] ABSTRACT

There is provided a semiconductor laser device capable of emitting a laser beam having stable transverse modes. A ridge type semiconductor laser device comprises an upper clad layer 15 left on its active layer to a thickness (d) between 0.25 and 0.50 m in order to ensure a stable production of fundamental transverse modes for laser operation and a rib-shaped clad layer 16 having a bottom width (W) between 2.0 μm and 3.5 μm and projecting from the upper clad layer in juxtaposition with the light emitting region of the active layer 13. When d and W are found within the respective ranges, the device emits a laser beam having stable transverse modes.

4 Claims, 6 Drawing Sheets

Far field angle (deg)

Far field angle (deg)

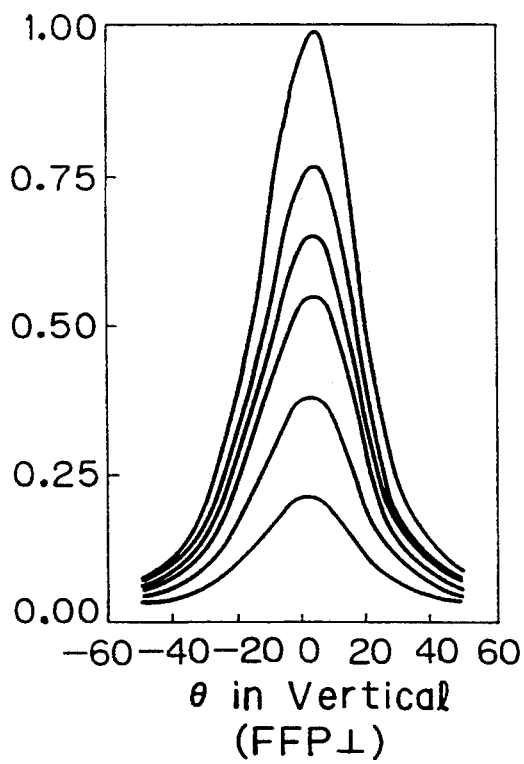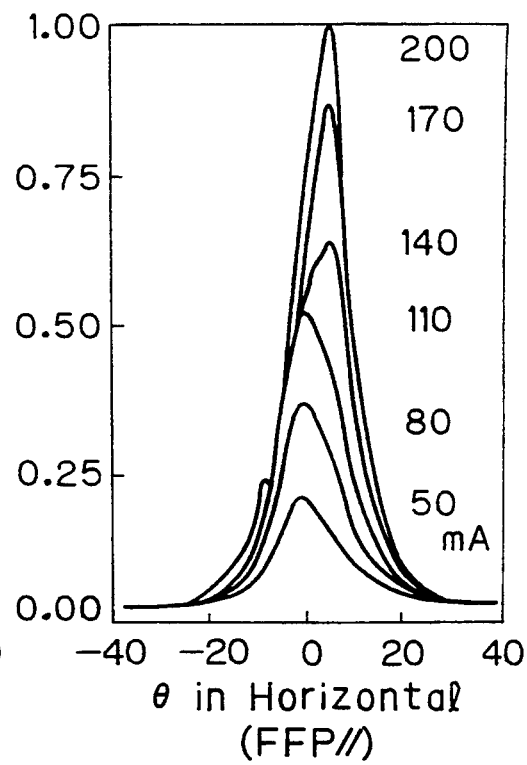
Fig. 7(a) — θ in Vertical (FFP⊥)
Fig. 7(b) — θ in Horizontal (FFP∥); 200, 170, 140, 110, 80, 50 mA

SEMICONDUCTOR LASER DEVICE

BACKGROUND OF THE INVENTION

1. Field of the Invention

This invention relates to a semiconductor laser device to be used in the field of optical telecommunication, optical amplification or optical instrumentation as a source of light having a wavelength in a band between 0.9 and 1.1 μm.

2. Prior Art

There have been proposed semiconductor laser devices comprising an InGaAs strained quantum well layer grown on a GaAs semiconductor substrate as an active layer and designed for use as a source of light having a wavelength in a band between 0.9 and 1.1 μm.

Some of the promising applications of such semiconductor laser devices include pumping light sources for rare earth ion doped optical fiber amplifiers purposes and short wave light sources for light having a wavelength between 0.45 and 0.55 μm, where such a semiconductor laser device is normally used in combination with one or more than one nonlinear optical devices.

In the field of pumping light source, semiconductor laser devices of the type under consideration are expected to be used in the near future as feasible sources of light (with a wavelength of 0.98 μm) for optical fibers doped with erbium designed for amplification of light (having a wavelength near 1.5 μm).

When a semiconductor laser device of the above described type is used as an pumping light source, it is optically connected to the small diameter optical waveguide of such as an optical fiber so that light emitted from the semiconductor laser device with a high output level of tens of several milliwatts should be effectively coupled into the optical waveguide.

The semiconductor laser device is required to oscillate to emit a beam in fundamental transverse modes to show a stable single lobe profile.

Various laser structures have been proposed for semiconductor laser devices to oscillate in fundamental transverse modes and, of these, a so-called ridge type laser structure is popularly used for InGaAs strained quantum well type semiconductor laser devices.

The reason why a ridge type laser structure is popularly used is that it can be suitably used for the above identified applications without requiring a strained active layer to be exposed or an exposed active layer to be buried in some other semiconductor layers.

Recently, a number of papers have reported the use of an InGaAs strained quantum well type semiconductor laser device comprising an InGaP clad layer in place of an AlGaAs clad layer.

Major advantages of using an InGaP clad layer in a semiconductor laser device are described in detail in Papers 1 through 4 listed below and a semiconductor laser device comprising such a clad layer is disclosed in Japanese Patent Laid Open No. Hei 3-222488.

Paper 1: J. P. Wittke and Ladany, J. Appl. phys., 48(1977) 3122.
Paper 2: J. Buns, IEEE J-QF QF-19(1983) 953.
Paper 3: T. Ohtoshi et al., Solid-State Electron., 30(1987) 627.
Paper 4: R. Lang, IEEE J-QF QF-15(1979) 718–726.

As described in the above papers, an InGaAs strained quantum well type semiconductor laser device having an InGaP clad layer allows wet etching to be carried out at a very high selection ratio.

Therefore, a high precision ridge type laser structure can be realized for a laser device of the type under consideration by inserting a very thin GaAs layer to part of an InGaP clad layer and then selectively etching a portion of the InGaP clad layer lying on the GaAs layer.

FIG. 1 of the accompanying drawings is a schematic sectional side view of a semiconductor laser device prepared in an above described manner.

The semiconductor laser device comprises an n-InGaP lower clad layer 12, an InGaAs strained quantum well active layer 13, a GaAs etching stop layer 14, a p-InGaP upper clad layer 15, a rib-shaped p-InGaP clad layer 16 for providing a ridge, a p-GaAs contact layer 17 and a pair of polyimide layers 18a and 18b sequentially formed on an n-GaAs semiconductor substrate 11. The device also comprises a metal p-electrode 19 covering the upper surfaces of the contact layer 17 and the polyimide layers 18a and 18b and a metal n-electrode 20 covering the lower surface of the semiconductor substrate 11.

Problems to be Solved by the Invention

A semiconductor laser device having a configuration as illustrated in FIG. 1 emits from its light emitting region Lz a light beam showing a horizontal (FFP ||) and a vertical beam divergence (FFP⊥) as shown in FIG. 3.

It is said that a semiconductor laser device as illustrated in FIG. 1 can effectively emit a light beam having a single peak profile if the width W of the bottom of the rib-shaped clad layer 16 providing a ridge is made small.

For example, a semiconductor laser device of FIG. 1 oscillates to emit a beam showing only a fundamental transverse mode as illustrated in FIG. 6(a) if W=3 μm, whereas one or more than one higher modes appear as shown in FIG. 6(b) if W=6 μm. A device emitting a beam with higher modes cannot be effectively coupled to a small diameter transmission path by way of a focusing lens.

It is also known that the specific value (Wc) of the width W of the bottom of the rib-shaped clad layer of a semiconductor laser device that can emit beam having a single peak profile varies as a function of the distribution of refractive index in the horizontal direction of the ridge type laser structure of the device. If the effective refractive index of a semiconductor laser device shows a difference of not greater than 1% between the ridge and the remaining areas, it emits a beam having a single peak profile when W<4 μm.

However, it is extremely difficult, if not impossible, to determine the value of Wc by calculation from the refractive indexes of the materials of a semiconductor laser device that correspond to the respective oscillation wavelengths of the materials. It is also difficult to verify the validity of the determined value.

Additionally, if a semiconductor laser device having a configuration as shown in FIG. 1 can successfully emit a beam having a single peak profile immediately after an electric current is injected thereto at a threshold level, it eventually varies the horizontal transverse mode of the beam it emits as the level of the injected current is raised.

This is a phenomenon the inventors of the present invention has found in an experiment which the inventors conducted. In the experiment, a semiconductor laser device having a configuration as shown in FIG. 1 and the following specific values was used.

Namely, the p-InGaP upper clad layer 15 had a thickness slightly smaller than 0.2 m and the rib-shaped p-InGaP clad layer 16 had a bottom width W of 3.0 μm.

The cavity length used for the experiment was 1,000 m long and a reflection film coating having a reflection factor of 95% was used for the rear mirror while a reflection film coating having a reflection factor of 10% was used for the front mirror.

FIGS. 7(a) and 7(b) are graphs respectively showing the current dependency characteristics of the horizontal transverse mode (FFP $\parallel$) and the vertical transverse mode (FFP$\perp$) of the beam observed in the above described experiment.

FIG. 7(a) shows that the center of beam was shifted by approximately 5 degrees while the level of the injected current was varied from 110 to 140 mA although the beam maintained a single peak profile.

FIG. 8 is a graph showing the relationship between the optical output power and the injected current (I-L relationship) of the semiconductor laser device of the above described experiment.

In FIG. 8, the solid line shows the I-L relationship in a free space whereas the dotted line shows the relationship between the optical output power at the corresponding terminal of an optical fiber when the transmission path of the optical fiber (having a core diameter $\phi$ of 8 m) and the semiconductor laser device was coupled with each other via a two-lens system and the injected current.

As clearly seen from FIG. 8, the semiconductor laser device used in the experiment showed kinks in the I-L relationship in a free space as the horizontal transverse mode is varied and the output power at the corresponding terminal of an optical fiber connected thereto dropped remarkably each time when the horizontal transverse mode had been varied to a significant extent immediately before.

This phenomenon is attributable to the fact that the light spot formed by the focusing lenses was moved by the significant variations in the horizontal transverse mode to reduce the coupling efficiency of the semiconductor laser device and the optical waveguide.

The results of the above experiment evidence that a semiconductor laser device of the type under consideration is required to emit a beam of light that maintains a single peak profile in the horizontal transverse mode and has a center of beam that would not be shifted immediately after the injection of an electric current to a threshold level nor when the level of the current being injected is raised to a higher level in later stages of operation.

SUMMARY OF THE INVENTION

In view of the above identified technological problems, it is therefore an object of the present invention to provide a semiconductor laser device capable of showing stable transverse modes.

According to the invention, the above object is achieved by providing a semiconductor laser device comprising an active layer arranged on a semiconductor substrate and covered by lower and an upper clad layers characterized in that said upper clad layer is partly left on said active layer to a thickness between 0.25 and 0.50 μm for oscillation of a basic transverse mode during laser excitation and that it further comprises a rib-shaped clad layer having a bottom width between 2.0 and 3.5 μm and projecting from the upper surface of said upper clad layer in juxtaposition with the light emitting region of said active layer.

The semiconductor substrate of a semiconductor laser device according to the invention is preferable made of GaAs and the lower and upper clad layers and the rib-shaped clad layer are preferable made of InGaP.

The active layer of a semiconductor laser device according to the invention is preferably an InGaAs strained quantum well layer.

The active layer may have an SCH or GRIN-SCH structure and/or a QW or MQW structure.

Effects

It is well known that the carriers contained in the active layer of a semiconductor laser device having a ridge type laser structure are partly lost when the level of the injected electric current is raised to increase the optical output power of the optical fiber connected thereto and the horizontal transverse mode which is a Fourier transform of the output varies accordingly.

This phenomenon may be attributable to the fact that carriers are particularly apt to be lost at the central area of the mesa where the optical density is high to produce a remarkable gain in lateral areas adjacent thereto so that hole burning may occur and that one or more than one higher modes are generated to change the distribution of optical density as the distribution of gain is varied.

In a semiconductor laser device according to the present invention, the upper clad layer is partly left on the active layer to a thickness between 0.25 and 0.50 μm and a rib-shaped clad layer having a bottom width between 2.0 and 3.5 μm is projecting from the upper surface of the upper clad layer in juxtaposition with the light emitting region of the active layer.

When the upper clad layer left on the active layer has a thickness between 0.25 and 0.50 μm, it can reduce the difference in the effective refractive index in the horizontal direction to effectively cut off the higher modes of the emitted beam and lower the optical density so that the possibility of producing the phenomenon of hole burning may be reduced.

When the rib-shaped clad layer has a bottom width between 2.0 and 3.5 μm, it can effectively cuts off the high modes of the emitted beam and at the same time reduces the possibility of producing hole burning because any loss of carriers is immediately followed by an injection of carriers by dispersion.

Thus, a semiconductor laser device according to the invention ensures a stable transverse mode that would not be easily varied.

Now, the present invention will be described in greater detail by way of a preferred embodiment.

BRIEF DESCRIPTION OF THE DRAWINGS

FIGS. 7(a) and 7(b) are graphs showing the current dependency characteristics of the horizontal transverse mode and the vertical transverse mode of the laser beam emitted by a known semiconductor laser device.

DETAILED DESCRIPTION OF THE INVENTION

Figure 1:
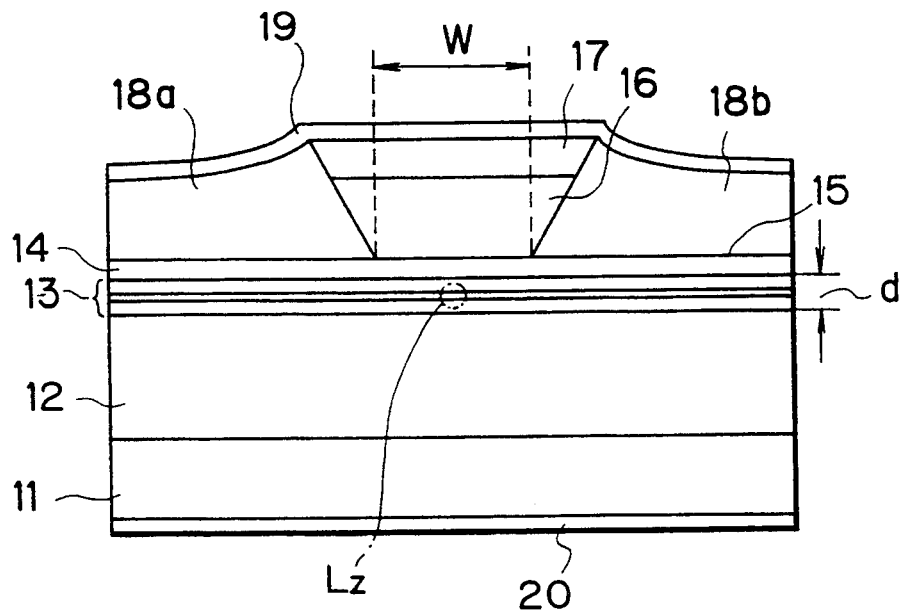
FIG. 1 is a schematic sectional view of a preferred embodiment of semiconductor laser device of the invention.

The preferred embodiment of the invention to be described hereinafter has a configuration as illustrated in FIG. 1 for a known semiconductor laser device.

More specifically, it comprises an n-InGaP lower clad layer 12, an InGaAs strained quantum well active layer 13, a GaAs etching stop layer 14, a p-InGaP upper clad layer 15, a rib-shaped p-InGaP clad layer 16, a p-GaAs contact layer 17 and a pair of polyimide resin layers 18a and 18b sequentially formed on an n-GaAs semiconductor substrate 11. The device also comprises a metal p-electrode 19 covering the upper surfaces of the contact layer 17 and the polyimide layers 18a and 18b and a metal n-electrode 20 covering the lower surface of the semiconductor substrate 11.

Figure 2:
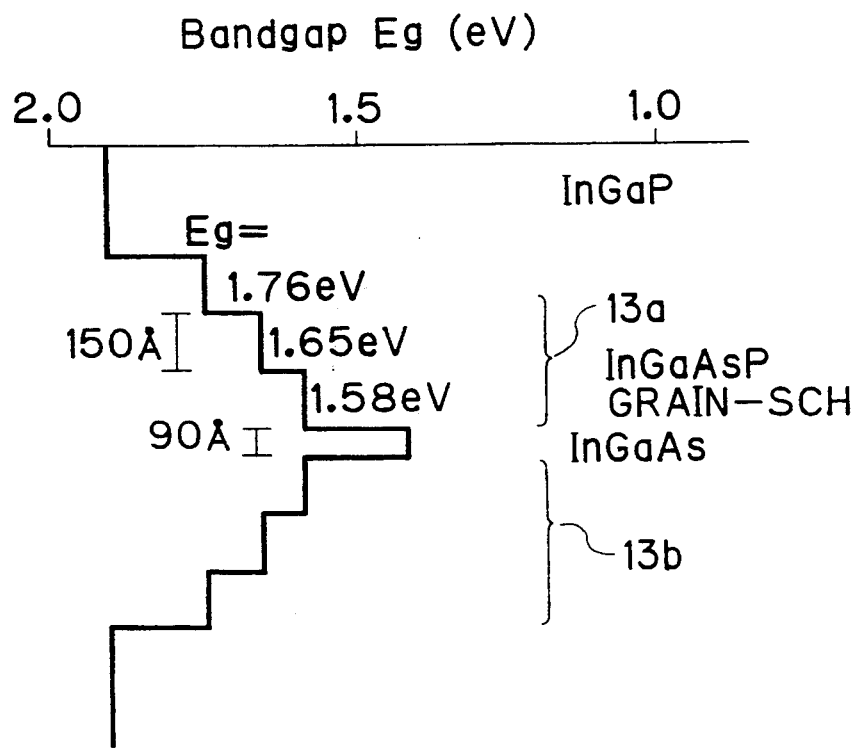
FIG. 2 is a schematic illustration of the bandgap energy level that varies as a function of the structures of the active layer of a semiconductor laser device according to the invention and having a GRIN-SCH structure.
Figure 3:
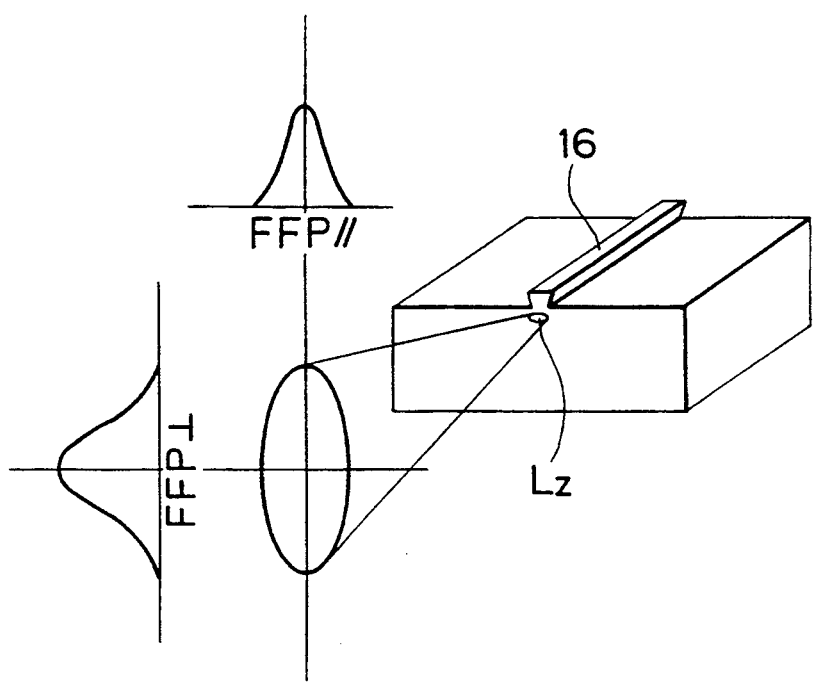
FIG. 3 is a graph showing the distribution of transverse mode of a laser beam emitted by a semiconductor laser device according to the invention.

As it may be apparent by referring to FIG. 2, the active layer 13 has GRIN-SCH structures 13a and 13b made of InGaP.

As defined earlier, the upper clad layer 15 of the embodiment has a thickness between 0.25 and 0.50 μm and the bottom of the rib-shaped clad layer 16 has a width between 2.0 and 3.5 μm.

Figure 4:
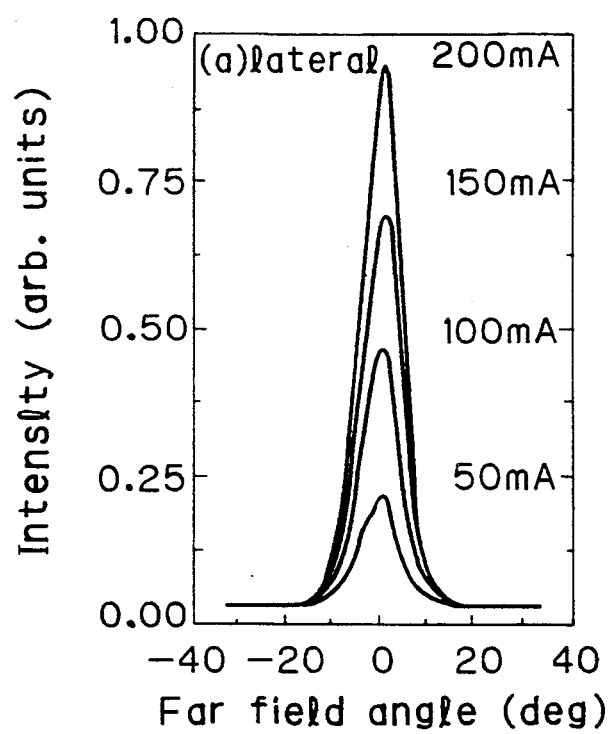
FIG. 4 is a graph showing the current dependency characteristics of the transverse mode of a laser beam emitted by a semiconductor laser device according to the invention.

FIG. 4 shows the current dependency characteristics of the horizontal transverse mode of a semiconductor laser device according to the invention when the upper clad layer 15 has a thickness d equal to 0.3 and the rib-shaped clad layer 16 has a bottom width W equal to 2.7 μm.

As clearly shown in FIG. 4, the beam emitted by a semiconductor laser device with d=0.3 μm and W=2.7 μm maintains a single peak profile and has a center that would not be shifted.

In an experiment conducted by the inventors of the present invention, the effectiveness of semiconductor laser devices according to the invention was determined.

The table below shows the probability of producing semiconductor laser devices capable of emitting a laser beam on a stable basis obtained in the experiment by varying the values of d and W and using at least 50 specimens for each d and W combination when an electric current was injected up to 200 mA.

| W\d | 0.10 μm | 0.15 μm | 0.20 μm | 0.25 μm | 0.30 μm |
|---|---|---|---|---|---|
| 2.0 μm | 0.05 | 0.05 | 0.20 | 0.80 | 0.75 |
| 2.5 μm | ~0 | ~0 | 0.05 | 0.80 | 0.80 |

-continued

| W\d | 0.10 μm | 0.15 μm | 0.20 μm | 0.25 μm | 0.30 μm |
|---|---|---|---|---|---|
| 3.0 μm | ~0 | ~0 | ~0 | 0.50 | 0.60 |
| 3.5 μm | — | — | ~0 | 0.30 | 0.40 |
| 4.0 μm | — | — | — | 0.10 | 0.10 |

As is apparent from the above table, a semiconductor laser device according to the invention can provide stable transverse modes at a high probability if the requirements of d>0.25 μm and W≦3.0 μm are met.

Note that if the bottom of the rib-shaped clad layer of a semiconductor laser device according to the present invention is made to have a width d greater than 0.5 μm, the device turns from the refractive index guide type to 10 μm or several times of 10 μm, making it difficult to be feasibly coupled with an optical fiber.

A semiconductor laser device according to the present invention can be prepared by using an appropriate method selected from known crystal growth techniques including the epitaxial growth method and photolithography techniques comprising a selective etching step for forming a mesa.

Then the value of d can be controlled by controlling the film thickness level (up to ±0.001 μm) made to grow by a crystal growth technique while that of W can be controlled by controlling the thickness (up to ±0.1 μm) of the photomask.

Figure 5:
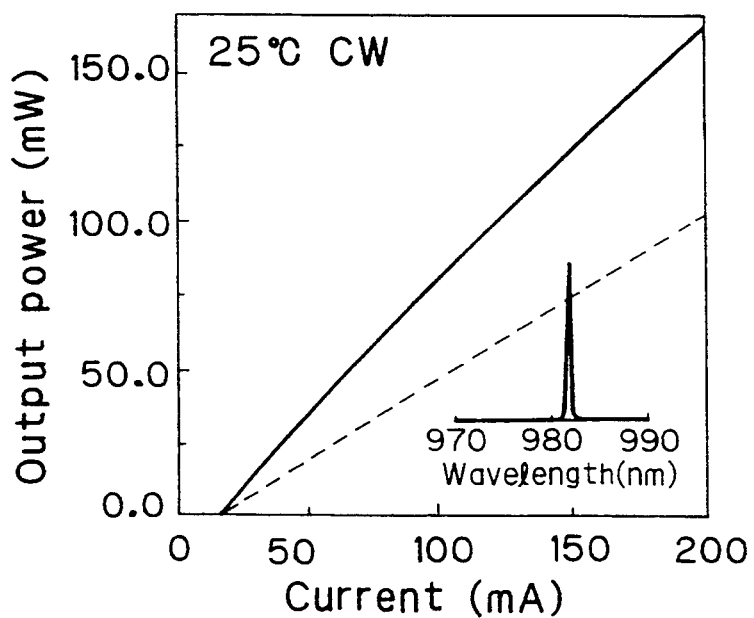
FIG. 5 illustrates graphs showing the relationship between the optical output power and the electric current of a semiconductor laser device according to the invention.
Figure 6:
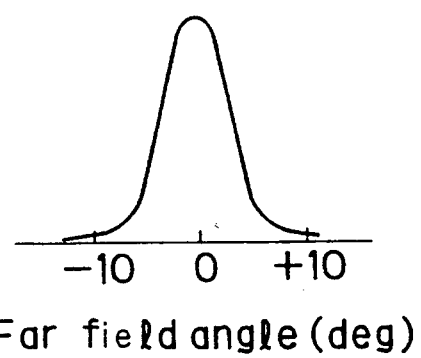
FIGS. 6(a) and 6(b) are graphs showing the horizontal transverse mode of the laser beam emitted by a semiconductor laser device immediately after injecting an electric current to a threshold level when its rib-shaped clad layer has a width W equal to 3 μm and 6 μm, respectively.
Figure 6:
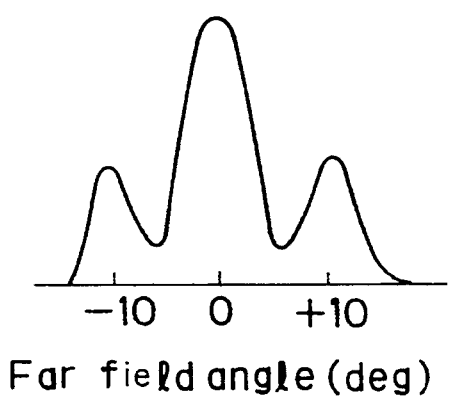
Figure 8:
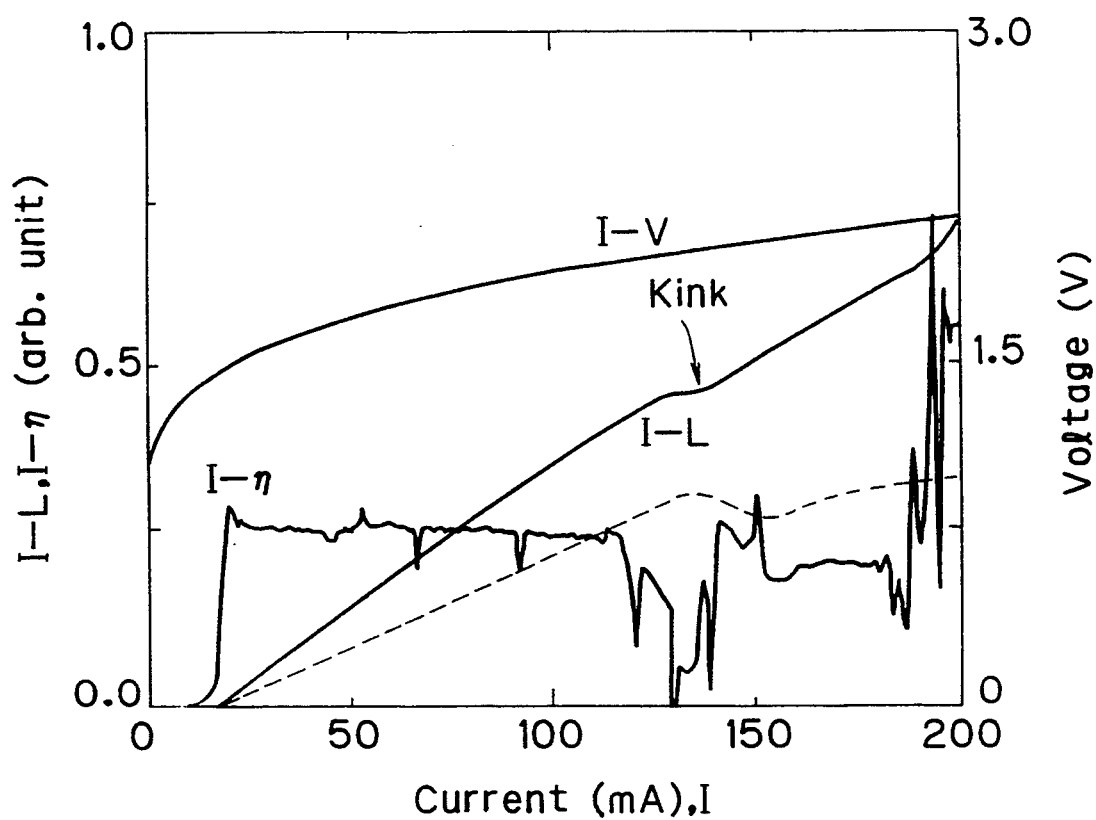
FIG. 8 is a graph showing the relationship between the optical output power and the electric current of a known semiconductor laser device.

FIG. 5 illustrates graphs showing the relationship between the optical output power and the electric current of a semiconductor laser device according to the invention, where the solid line represents the I-L relationship in a free space while the dotted line represents the relationship between the optical output power at the corresponding terminal of an optical fiber coupled thereto and the electric current of the device as described earlier by referring to FIG. 8.

As clearly shown in FIG. 5, a semiconductor laser device according to the invention does not show any kinks in a free space nor at the terminal of the optical fiber to ensure a desirable coupling condition existing between the semiconductor laser device and the optical fiber.

It should be noted that the present invention is not limited to a semiconductor laser device having a configuration as illustrated in FIG. 1 and can be effectively used for a semiconductor laser device comprising an active layer having an SCH structure and/or a MQW structure.

The horizontal confinement layers 18a and 18b of a semiconductor laser device according to the invention may be made of a dielectric material other than polyimide so long as it has a refractive index smaller than that of InGaP.

Materials that can be used for the horizontal confinement layers 18a and 18b includes $SiO_2$, $SiN_x$, $Al_2O_3$, a variety of synthesized resin materials and semiconductor compounds such as AlInGaP.

Advantage of the Invention

Since a ridge type semiconductor laser device according to the invention comprises an upper clad layer left on the active layer to a thickness between 0.25 μm and 0.50 μm so that it can oscillate to emit a laser beam having fundamental transverse modes for laser operation and, at the same time, a rib-shaped clad layer having a bottom width between 2.0 μm and 3.5 μm projecting from the upper surface of the upper clad layer in juxtaposition with the light emitting region of the active layer so that a stable production of transverse modes is ensured.

What is claimed is:

1. In a semiconductor laser device comprising an active layer arranged on a semiconductor substrate and covered by lower and upper clad layers, the improvement comprising that said upper clad layer is partly left on said active layer to a thickness between 0.25 and 0.5 $\mu$m for oscillation of a basic transverse mode during laser excitation and a rib-shaped clad layer having a bottom width between 2.0 $\mu$m and 3.5 $\mu$m and projecting from the upper surface of said upper clad layer is juxtaposed with the light emitting region of said active layer.

2. A semiconductor laser device according to claim 1, wherein the active layer has an InGaAs strained single quantum well layer.

3. A semiconductor laser device according to claim 1, wherein the active layer has an SCH structure.

4. A semiconductor laser device according to claim 1, wherein the active layer has InGaAs strained multiquantum well layers.

* * * * *